United States Patent [19]
Sahota

[11] Patent Number: 5,880,631
[45] Date of Patent: Mar. 9, 1999

US005880631A

[54] HIGH DYNAMIC RANGE VARIABLE GAIN AMPLIFIER

[75] Inventor: Gurkanwal S. Sahota, San Diego, Calif.

[73] Assignee: Qualcomm Incorporated, San Diego, Calif.

[21] Appl. No.: 789,108

[22] Filed: Jan. 27, 1997

Related U.S. Application Data

[60] Provisional application No. 60/012,382 Feb. 28, 1996.

[51] Int. Cl.$^6$ ................................................. H23G 3/30
[52] U.S. Cl. ........................ 330/51; 330/254; 330/283
[58] Field of Search .......................... 330/51, 254, 283; 455/74, 93

[56] References Cited

U.S. PATENT DOCUMENTS

| | | | |
|---|---|---|---|
| 3,641,450 | 2/1972 | Lunn | 330/254 |
| 4,562,406 | 12/1985 | Baker | 330/310 X |
| 4,963,836 | 10/1990 | Noguchi et al. | 330/254 |
| 5,157,350 | 10/1992 | Rubens | 330/254 |
| 5,418,494 | 5/1995 | Betti et al. | 330/283 X |
| 5,451,901 | 9/1995 | Welland | 330/254 X |

FOREIGN PATENT DOCUMENTS

| | | | |
|---|---|---|---|
| 0632583 | 1/1995 | European Pat. Off. | H03G 1/00 |
| 0105810 | 3/1989 | Japan | H03C 3/00 |

OTHER PUBLICATIONS

Manfred Lang, "The Intermodulation Problem in Mobile Communications" by Manfred Lang;. *Microwave Journal;* May 1995, pp. 20–28.

"A DC to 1–Ghz Differential Monolithic Variable–Gain Amplifier" by Robert G. Meyel; *IEEE 1991,* pp. 1673–1679.

"A Wideband Low–Noise Variable–Gain Bi–CMOS Transimpedance Amplifier" by Robert G. Meyer; *IEEE 1994,* pp. 2/7–7/7.

"HBT Technology Adds Power to CDMA Chip Set" By Jerry Neal; Microwave & RF, Dec. 1994, pp. 205–207.

"Design of High–Performance Negative–Feedback Amplifiers", by Ernst H. Nordholt *Studies in Electrical and Electronic Engineering 7, 1983,* pp. 34–135.

"A Downconverter for Use in a Dual–Mode AMPS/CDMA Chip Set" By A. Brunal et al. *Microwave Journal,* Feb. 1996, pp. 20–42.

*Primary Examiner*—James B. Mullins
*Attorney, Agent, or Firm*—Russell B. Miller; Brian S. Edmonston; Roger W. Martin

[57] ABSTRACT

A multi-stage low power, high dynamic range variable gain amplifier comprises an input stage cascaded with one or more current amplifier stages, whereby the gain of each stage may be independently controlled. The input stage may be comprised of a variable transconductance amplifier using variable emitter degeneration. The current amplifier may be comprised of a differential Darlington amplifier coupled to a differential cascode amplifier. The transconductance amplifier converts an input voltage signal to a current signal. The variable gain amplifier is designed for efficient low power operation.

18 Claims, 9 Drawing Sheets

HIGH DYNAMIC RANGE VARIABLE GAIN AMPLIFIER

This is a Provisional Application Ser. No. 60/012,382 filed Feb. 28, 1996.

BACKGROUND OF THE INVENTION

I. Field of the Invention

The present invention relates to variable gain amplifiers (VGAs) and particularly to VGAs used in communication devices.

II. Description of the Related Art

In a wireless communication environment, a wireless communications receiver may receive a signal which experiences rapid and wide variations in signal power. In receivers such as are used in a wideband digital code division multiple access (CDMA) mobile station, it is necessary to control the power of the demodulated signal for proper signal processing. Furthermore, in transmitters such as are used in a CDMA mobile station, it is necessary to control the transmit power in order to avoid excessive interference to other mobile stations. These same power control considerations apply to narrowband analog frequency modulation (FM) wireless communication system receivers and transmitters.

Dual-mode CDMA/FM wireless communications devices exist which are required to provide power control of transmitted and received signals of both digital CDMA and analog FM modulation. In these dual-mode mobile stations, the control process is complicated by the differing dynamic ranges and industry regulation standards associated with the CDMA and FM signals. That is, the magnitude of the received CDMA signals may vary over a range of approximately 80 dB, whereas the magnitude of the received FM signals may vary over a range of as much as 100 dB. The provision of separate automatic gain control (AGC) circuitry for both the CDMA and the FM signals increases the complexity and expense of such dual-mode mobile stations. Accordingly, it is desirable to provide AGC circuitry capable of operating upon both the CDMA and FM signals.

FIGS. 1A and 1B illustrate an exemplary environment for a VGA performing AGC functions. FIGS. 1A and 1B are a block diagram of a dual-mode CDMA/FM cellular telephone 900 designed, for example, in accordance with the telecommunication industry standard "Mobile Station-Base Station Compatibility Standard for Dual-Mode Wideband Spread Spectrum Cellular System," TIA/EIA/IS-95, generally referred to simply as IS-95. A VGA is used for receive and transmit AGC amplifiers 902, 904 respectively, of cellular telephone 900. The front end receiver portion of cellular telephone 900 comprises antenna 906, duplexer 908, low noise amplifier (LNA) and mixer circuit 910, and filter 930. As cellular telephone 900 travels throughout the coverage area of a CDMA system, the signal level at antenna 906 varies from about −110 dBm to −30 dBm. Note that each of these front end elements generally provides the same gain no matter what signal level is applied to it over the operating range such that the dynamic range of the signal which is applied to receive AGC amplifier 902 is the same as the dynamic range of the signal at antenna 906, approximately 80 dB. Similarly, when the cellular telephone 900 travels throughout the coverage area of an FM system, the signal level at the antenna varies approximately 100 dB.

The output of receive AGC amplifier 902 is provided to baseband analog application specific integrated circuit (BAASIC) 912 which converts the analog signal to a digital signal. The analog to digital signal conversion process works best if the signal level which is applied to the analog to digital converter remains constant. Receive AGC amplifier 902 performs the function of compensating for the variations input power such that the output power of receive AGC amplifier 902, and thus the input to the analog to digital converter, remains constant.

Mobile station modem ASIC 914 provides demodulation for both the CDMA and FM signals, as well as various digital and power control functions associated with CDMA operation. Such functions are well known in the art and not critical to the present invention, and thus are not described further herein. User interfaces 916 provide the interface to the human operator. Such user interfaces 916 are also well known in the art and not critical to the present invention, and are thus not described further herein.

Mobile station modem ASIC 914 also provides a baseband modulated digital representation of the CDMA waveform, or a modulated analog representation of the FM waveform to BAASIC 912. BAASIC 912 converts the baseband signals representation to analog intermediate frequency (IF) form at a constant signal level and supplies it to transmit AGC amplifier 904. Transmitter AGC amplifier 904 provides power control to the signal and supplies it to upconverter 918, power amplifier and driver circuitry 920, isolator 922, duplexer 908 and antenna 906. As cellular telephone 900 travels throughout the coverage area of a cellular system, the transmit signal level at antenna 906 varies inversely from receive power in that when the receive power is at a minimum the transmit level is near the maximum. This variation in transmit power level is accomplished by AGC amplifier 904. Note that the input power to AGC amplifier 904 is typically fixed, and the gain of power amplifier 920 may also be fixed.

More information about the automatic gain control loop in a wireless communication system and about power control in general can be found in U.S. Pat. No. 5,283,536, entitled "HIGH DYNAMIC RANGE CLOSED LOOP AUTOMATIC GAIN CONTROL CIRCUIT" issued Feb. 1, 1994, U.S. Pat. No. 5,107,225, entitled "HIGH DYNAMIC RANGE CLOSED LOOP AUTOMATIC GAIN CONTROL CIRCUIT" issued Apr. 21, 1992, U.S. Pat. No. 5,267,262 entitled "TRANSMITTER POWER CONTROL SYSTEM" issued Nov. 30, 1993, U.S. Pat. No. 5,469,115 entitled "METHOD AND APPARATUS FOR AUTOMATIC GAIN CONTROL IN A DIGITAL RECEIVER" issued Nov. 12, 1995 and U.S. Pat. No. 5,283,536 entitled "HIGH DYNAMIC RANGE CLOSED LOOP AUTOMATIC GAIN CONTROL CIRCUIT" issued Oct. 26, 1993, each of which is assigned to the assigned hereof and incorporated herein by reference.

Mobile communication receivers and transmitters like those described above are designed to have a high compression point, low noise injection and low power consumption. Receivers with a high compression point and low noise injection have a high dynamic range in that they can detect signals over a wide range of power levels. Transmitters with a high compression point and low noise injection have a high dynamic range in that they can transmit signals over a wide range of power levels. Receivers and transmitters with low power consumption increase battery life. Hence, these characteristics are important when designing a variable gain amplifier for a communication system in which signals are transmitted and received over a large range of power levels.

A receiver should be able to detect information from both a strong signal broadcast by a nearby and powerful transmitter and a weak signal broadcast by a distant and low power transmitter. The extent over which the receiver can detect weak to strong signals is termed its dynamic range. Likewise, a transmitter should be able to transmit low powered signals to a nearby receiver and high power signals to a distant receiver.

The dynamic range of a receiver is established by its minimum detectable and maximum detectable signal levels. The minimum detectable signal level of a receiver is determined by the receiver's noise figure. Likewise the minimum transmittable power is set by the transmitters noise figure if the signal level falls near or below the noise floor. A VGA's noise figure is in part a function of the noise injection properties and gain of the VGA. In general, the higher the receiver's gain, the better it's noise figure; i.e. the better able it is to detect a very weak signal in the presence of noise.

The maximum detectable signal level of a receiver may be established by the receiver's intermodulation distortion (IMD) performance. When multiple signals pass through any device, mixing action between the signals occurs because of the non-linearities of the device. For example, in a location where CDMA and analog FM systems co-exist, third-order IM products from the analog FM system generally fall within the CDMA passband. This IM products act as "jammers" that contribute to IMD which can interfere with detection and demodulation of the desired signal within the receiver. A VGA's IMD performance is in part a function of its linearity and its gain. In general, the lower the receiver's gain, the better it's IMD performance. This is in contrast to the noise figure requirements as described above. Thus, design of a VGA for a receiver with a large dynamic range includes the difficult tradeoff between IMD performance and noise figure.

Similar design considerations are relevant with respect to transmitter VGAs, with the difference being that generally, receiver VGAs are designed to provide a relatively constant output power level for a varying range of input power levels while transmitter VGAs are designed to receive relatively constant input power levels and provide a varying range of output power levels.

Furthermore, mobile receivers are designed to be compact, lightweight, and have a long operating lifetime. Mobile receivers are powered by a minimal number of battery cells to reduce their size and weight to enhance their portability. Because battery voltage is proportional to the number of battery cells, the AGC circuitry, including the variable gain amplifier (VGA), must operate at low supply voltages. It is also desirable to enhance battery lifetime in order to increase the period between battery replacement or recharging. Therefore, the AGC circuitry, including its VGA, should consume little DC current and power.

This requirement for low DC power consumption also implies a design tradeoff similar to that already mentioned. More DC power is required for a high gain amplifier that has good noise figure. However, less DC power is required for a low gain amplifier that has good IMD performance. Existing VGA designs are inefficient in that they are unable to conserve DC power sufficiently at low gain levels.

What is needed is a VGA with a high dynamic range, good noise figure and IMD performance, as well as low DC power consumption.

SUMMARY OF THE INVENTION

In accordance with the present invention, there is provided a VGA having a high dynamic range, good noise figure and IMD performance, and minimal DC power consumption. The VGA may be used in automatic gain control (AGC) amplifiers for the receiver and transmitter chains in a cellular telephone. The VGA achieves power gain by converting an input voltage signal to a current signal and amplifying the current signal. The amplified current signal may be converted to a voltage signal by terminating the VGA with an appropriate impedance.

The VGA is comprised of at least two cascaded stages, an input stage and a current amplifier. The input stage may be further separated into a CDMA input stage and an FM input stage, with the outputs of both input stages being coupled to the input of the current amplifier, and being selectable by a CDMA/FM mode signal. In one embodiment, the FM input stage is single-ended, and the CDMA input is balanced. The gain of the VGA may be increased by successively cascading two or more current amplifier stages. The transconductance gain of the input stages may be controlled by a control signal.

The high dynamic range, low power VGA is made using a combination of techniques. In a first embodiment, well suited for a dual-mode receive AGC amplifier such as amplifier 902 of FIG. 1, the CDMA input stage is comprised of a variable transconductance amplifier cascaded with a Gilbert cell attenuator. The variable transconductance amplifier converts a varying voltage signal to an output current signal with a transconductance that is controlled by a FET transistor acting as a variable emitter degeneration resistor. The emitter degeneration provides variable local series feedback which allows the CDMA input stage to handle a wide dynamic range of input signals, while providing good noise figure and IMD performance. In the presence of a low level input signal, the channel resistance of the FET transistor may be varied to increase the gain of the input stage, thereby improving the receiver's noise figure and ability to detect weak signals. On the other hand, in the presence of a high level input signal, the channel resistance of the FET transistor may be varied to decrease the gain of the input stage, thereby improving the receiver's IMD performance. The Gilbert cell attenuator provides additional current attenuation so that any later current amplification stages to not get overdriven into their non-linear range when a large input signal is applied.

In this first embodiment, the FM input stage is a bipolar differential amplifier with emitter degeneration, followed by a Gilbert cell attenuator. The differential pair converts the input voltage to a current and feeds the Gilbert cell attenuator, which further attenuates the current flowing into the next stage of the current amplifier. Unlike the CDMA input stage, the FM input stage uses a fixed gain transconductance stage rather than variable emitter degeneration because the industry standard (IS-95) linearity requirement for FM signals is much more relaxed than that for CDMA signals, allowing the amplifier to saturate into non-linearity much sooner.

In a second embodiment, well suited for a transmit AGC amplifier such as amplifier 904 of FIG. 1, both FM and CDMA signals may be handled by an fixed-gain transconductance input stage comprising a differential pair with shunt-series feedback at the input, followed by a transconductor and Gilbert cell attenuator. The shunt-series feedback at the input allows for an accurate and linear input impedance without using a brute force match. The output of the differential pair may be AC coupled to the transconductor by a pair of capacitors. The transconductor converts the voltage output of the differential pair to a current using an emitter-degenerated differential amplifier. The current is then fed to the Gilbert cell attenuator which further attenuates the current flowing into the next stage of the current amplifier. A variable gain input stage is not required because the input level to the transmit AGC amplifier 904 is generally constant.

In the first embodiment, suited for use as receive AGC amplifier 902, each of the current amplifiers are comprised of two sections, a differential Darlington amplifier and a differential cascode amplifier. These current amplifiers are translinear circuits which allow the current gain to be controlled by varying the ratio of the "tail currents" which bias the translinear loop. The current gain of each current amplifier stage may be independently controlled by one or more control signals.

In the second embodiment, suited for use as a transmit AGC amplifier 904, each of the current amplifiers is comprised of two sections, a differential Darlington amplifier, and a simple differential pair. This current amplifier is a hybrid of a feedback current amplifier and a translinear loop.

In each of the above-mentioned embodiments, the gain of the variable-gain stages is controlled by a gain control circuit which varies the gain of the current amplifiers according to the AGC control voltage applied (either RX GAIN CONTROL or TX GAIN CONTROL of FIG. 1). The gain control circuit includes an exponential function generator which ensures the linearity (in dB) of the VGA over the wide dynamic range.

It is accordingly a benefit of the present invention to provide a VGA that has a high dynamic range over both CDMA and FM signals. A mobile receiver utilizing such a VGA can detect signals over wider input power ranges. A further benefit is that the VGA consumes minimal DC power. Therefore, the VGA may be used in a mobile communication device and advantageously conserve the operating lifetime of the batteries. An additional benefit is that the VGA's gain can be varied approximately linearly in dB by linearly adjusting DC control voltages.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

The present invention is directed to a monolithic integrated circuit variable gain amplifier (VGA). The VGA provides gain in proportion to a control voltage. The VGA provides exponential voltage gain as a function of linear increases in the applied control voltage thereby providing approximately linear power gain in decibels (dB) in direct proportion to linear increases in applied control voltage. The VGA can provide linear power gain over a large dynamic range in excess of 80 dB (or a factor of 1 to 100,000,000.) The VGA provides a linear power gain which is tolerant of process variations which occur during VGA fabrication.

The VGA can be used in many applications including in receivers and transmitters. If the VGA is functioning in a receiver, the input to typically varies over a large dynamic range while the output of the VGA is relatively constant. When the signal level input into the VGA functioning in a receiver is small the gain of the VGA must be relatively large. When the signal level input into the VGA functioning in a receiver is large, the gain of the VGA must be relatively small. Thus a VGA functioning in a receiver must typically have good noise performance when it is providing relatively high gain and good intermodulation performance when providing relatively low gain.

If the VGA is functioning in a transmitter, the input is typically constant while the output of the VGA varies over a wide dynamic range. When the signal level output of the VGA needs to be large, the gain of the VGA must be relatively large and the intermodulation performance must support the resulting large signal levels. When the signal level output from the VGA functioning in a transmitter needs to be small, the gain of the VGA must be relatively small and the noise performance of the VGA may be important.

Figure 1A:
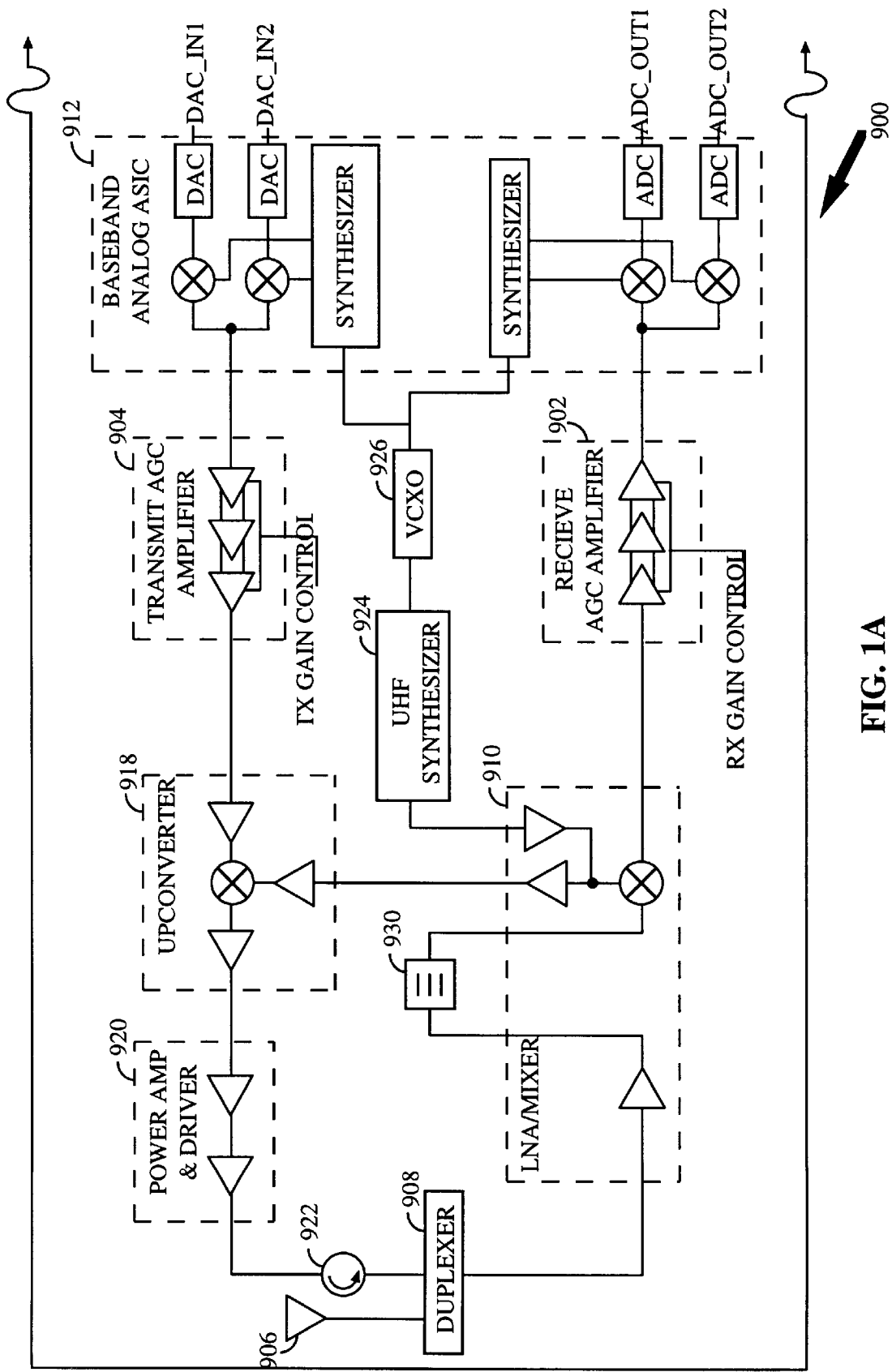
FIGS. 1A and 1B are a schematic diagram of an exemplary dual-mode CDMA/FM communication device capable of use with the present invention.
Figure 1B:
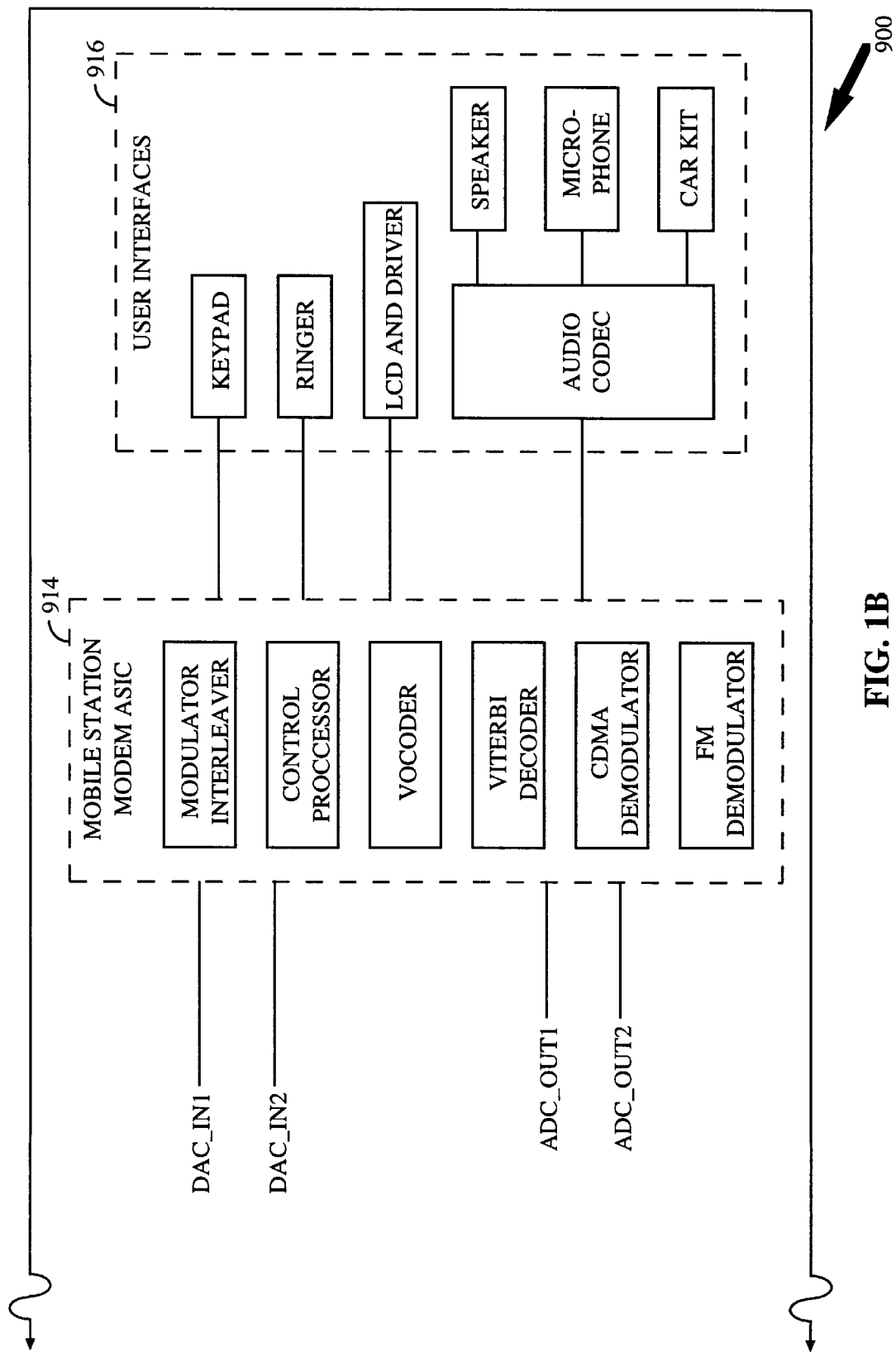
Figure 2:
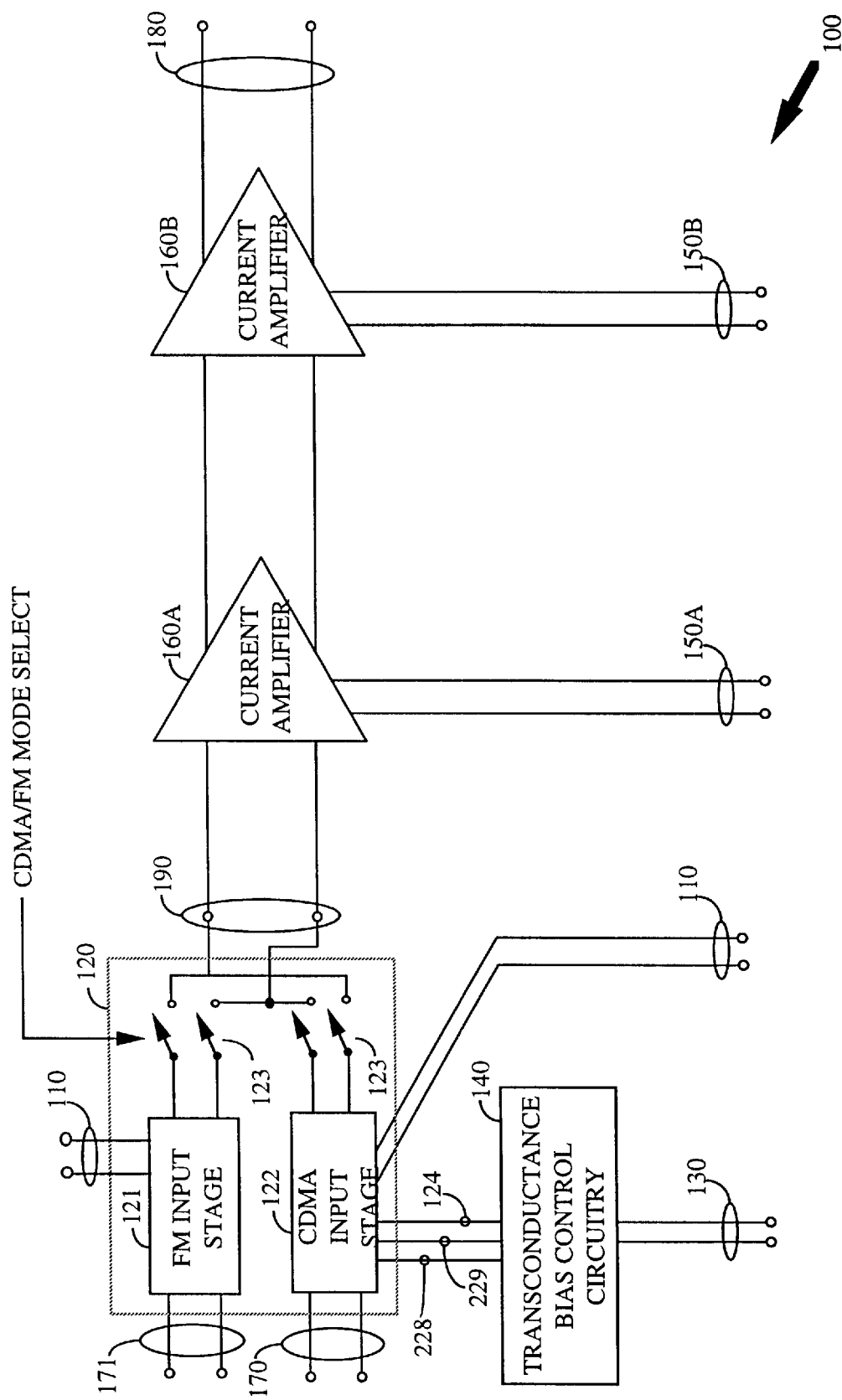
FIG. 2 is a block diagram of an exemplary triple stage variable gain amplifier of the present invention.

FIG. 2 is a block diagram of one embodiment of variable gain amplifier (VGA) 100 that adjusts the power level of an input signal over a wide dynamic range. The embodiment of FIG. 2 is suitable for use as receive AGC amplifier 902 of FIG. 1. VGA 100 comprises three stages: input stage 120 and two cascaded current amplifier stages 160A and 160B. More than one current amplifier stage 160 is successively cascaded after input stage 120 to increase the dynamic range of VGA 100. In a first embodiment, input stage 120 comprises a separate FM input stage 121 and CDMA input stage 122 with respective input ports 171 and 170. FM input stage 121 and CDMA input stage 122 are alternately connected to current amplifier 160A through switches 123, which are controlled by the CDMA/FM mode select signal. When the communication device is in CDMA mode, the switches 123 connect the CDMA input stage 122 to the current amplifier 160A and disconnect the FM input stage 121. Conversely, when the communication device is in the FM mode, the switches 123 connect the FM input stage 121 to current amplifier 160A and disconnect the CDMA input stage 122.

FIG. 2 also illustrates bias ports 110, 130, 150A, 150B for the control voltages to be applied to VGA 100. The gain of each stage is controlled by control voltages which, for example, may be generated by receiver detection circuitry that determines the signal strength. Each stage is comprised of a variety of components, including an active device such as a transistor.

The VGA input signal provided on input ports 170 of CDMA input stage 122 is balanced, i.e. split into two signal paths each carrying a signal one hundred and eighty degrees out of phase from the another. The VGA input signal is injected via VGA's input port 170. However, the VGA input signal provided on input ports 171 of FM input stage 121 is single-ended. The output of input stage 120 and the input of current amplifier 160A are coupled through port 190.

Because it operates with a low supply voltage, about 3.6 volts, input stage 120 converts the input voltage signal to a current signal to prevent the VGA active devices from operating in their non-linear region, and distorting the input signal. The low supply voltage of VGA 100 also reduces the power consumption of VGA 100.

Figure 3:
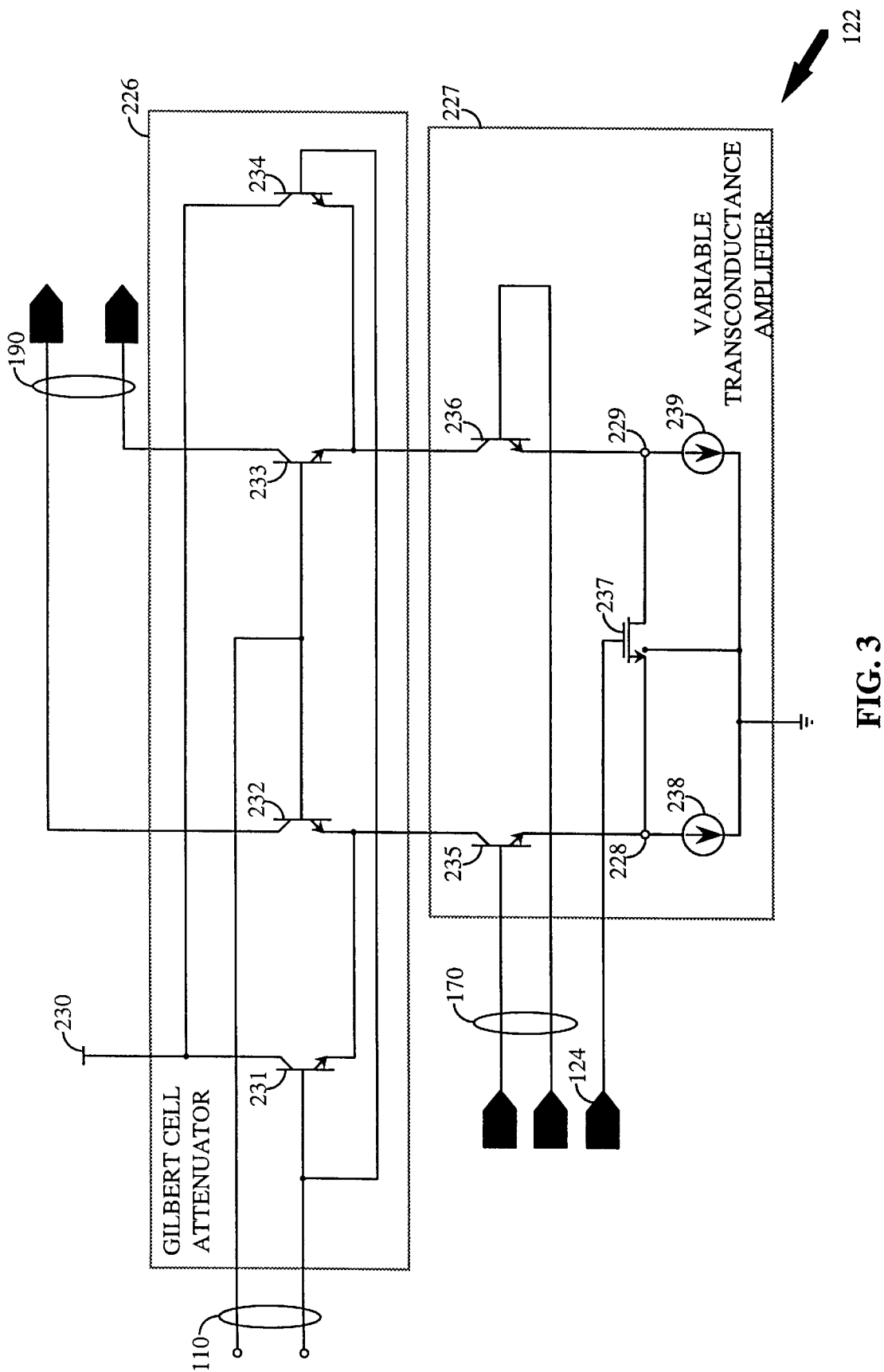
FIG. 3 is a diagram of the CDMA input stage of FIG. 2.

FIG. 3 illustrates one embodiment of the CDMA input stage 122. The balanced signal is injected into VGA's input port 170. CDMA input stage 122 comprises variable transconductance amplifier 227 coupled to Gilbert cell attenuator 226 and serves four functions. First, the variable transconductance amplifier 227 converts the input voltage signal to a current signal. Second, the combination of the variable transconductance amplifier 227 and Gilbert cell attenuator 226 permits variable amplification of the signal, which may be varied exponentially (linearly in dB) by linearly adjusting control voltages at bias port 110. Third, increased emitter degeneration in variable transconductance amplifier 227 reduces the IMD of VGA 100 when the input signal voltage is large and the IMD would be most prominent. As emitter degeneration in the variable transconductance amplifier 227 is increased, the transconductance, and thus the IMD, of input stage 120 are decreased. Finally, decreased emitter degeneration in variable transconductor amplifier 227 improves the noise figure of VGA 100 when the input signal voltage is small and noise performance is the most critical. As emitter degeneration in variable transconductance amplifier 227 is decreased, the transconductance of the input stage 120 is increased, improving the noise figure of the receiver.

Variable transconductance amplifier 227 is comprised of two bipolar junction transistors (BJTs) 235 and 236, two current sources 238, 239, and field effect transistor (FET) 237. Current sources 238, 239 are serially connected to the emitters of the BJTs 235 and 236. Source connection 228 and drain connection 229 of FET 237 are respectively connected to the emitters of the BJTs 235 and 236. The balanced signal at VGA input port 170 is applied to the bases of BJTs 235 and 236. The balanced current output of variable transconductance amplifier 227 flows from the collectors of the BJTs 235 and 236.

The transconductance of variable transconductance amplifier 227 may be adjusted by varying the emitter degeneration of BJTs 235 and 236. As a result, the gain of VGA 100 may be varied. Emitter degeneration of BJTs 235 and 236 is created by varying the channel resistance of FET 237. The FET 237 is operated like a variable resistor in its ohmic region and provides variable emitter degeneration for both BJTs 235 and 236. The drain-source bias voltage of the FET 237 must therefore be less than the knee voltage of the FET 237. The channel resistance may be varied by adjusting the bias across the gate-source junction of the FET 237 by varying the voltage applied at bias port 290. The transconductance of variable transconductance amplifier 227 can be increased by decreasing the channel resistance of the FET 237. Thus, the present invention, by providing the variable channel resistance through FET 237 allows both the competing design considerations of noise figure and IMD performance to be accommodated. Furthermore, the DC efficiency of the VGA 100 is improved because the CDMA input stage 122 draws enough DC current as is necessary to amplify low level input signals, while reducing the DC current consumption of later current amplification stages when lowering its transconductance for high level input signals.

The differential output currents of variable transconductance amplifier 227 are coupled to Gilbert cell attenuator 226. Gilbert cell attenuator 226 varies the current amplitude of a signal applied to its inputs. Gilbert cell attenuator 226 comprises first pair of BJTs 231 and 234, and second pair of BJTs 232 and 233. The attenuation level of Gilbert cell attenuator 226 is established by a control voltage applied at bias port 110. Gilbert cell attenuator 226 attenuates the output current of variable transconductance amplifier 227 when first pair of BJTs 231 and 234 are biased by the control voltage applied to bias port 110 so that a component of the variable transconductance amplifier's output current flows through the first pair of BJTs 231 and 234 rather than through the second pair of BJTs 232 and 233. Hence the balanced currents at port 190 of Gilbert cell attenuator 226 are diminished. Both variable transconductance amplifier 227 and Gilbert cell attenuator 226 are biased by common power supply 230.

The preferred embodiment of the FM input stage 121 is similar to that of CDMA input stage 122 except that FET 237 is replaced by a fixed resistance. As previously mentioned, the fixed resistance of the FM input stage 121 provides a fixed transconductance because industry standards, such as IS-95, allow compression of the input signal (i.e. the VGA is allowed to go non-linear) at a much lower input level than that of the CDMA input signal. Alternatively, the input stage 120 may comprise only a single fixed transconductance stage similar to that of the FM input stage 121. This alternate embodiment would be especially well suited for use as the transmit AGC amplifier 904 of FIG. 1.

Figure 4:
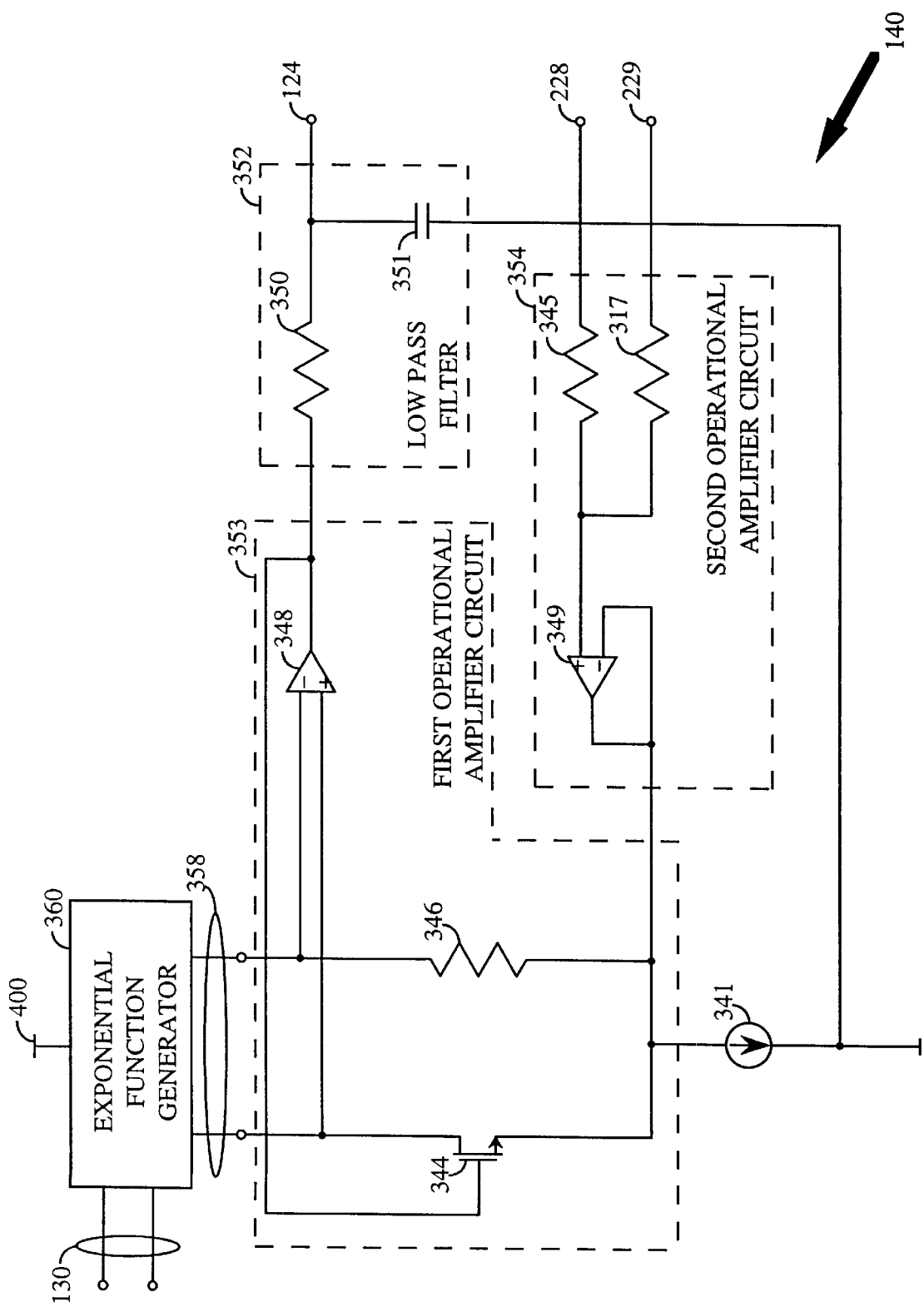
FIG. 4 is a diagram of the transconductance amplifier bias control circuit of FIG. 2.

As noted above, one aspect of the design is that transconductance of the variable transconductance amplifier 227 varies exponentially as the control voltage applied to bias port 130 of transconductance bias control circuitry 140 is linearly adjusted. To effect this result, FET 237 channel resistance also varies exponentially as the control voltage at bias port 130 of the transconductance bias control circuitry 140 is linearly adjusted. FIG. 4 illustrates one embodiment of transconductance bias control circuitry 140 which facilitates this result. Transconductance bias control circuitry 140 includes exponential function generator 360, first and second operational amplifier circuits 353 and 354, low pass filter 352, and current source 341.

Exponential function generator 360 converts the control voltage applied at bias port 130 to two output currents flowing from output 358 of exponential function generator 360 to first operational amplifier circuit 353. The ratio of the amplitudes of these currents is exponentially proportional to the control voltage. The control voltage, in the exemplary embodiment of FIG. 1 is either RX GAIN CONTROL or TX GAIN CONTROL or a scaled or temperature compensated version thereof. The generation of this control voltage is beyond the scope of the present invention, and described elsewhere such as U.S. Pat. No. 5,469,115, incorporated by reference above.

Figure 5:
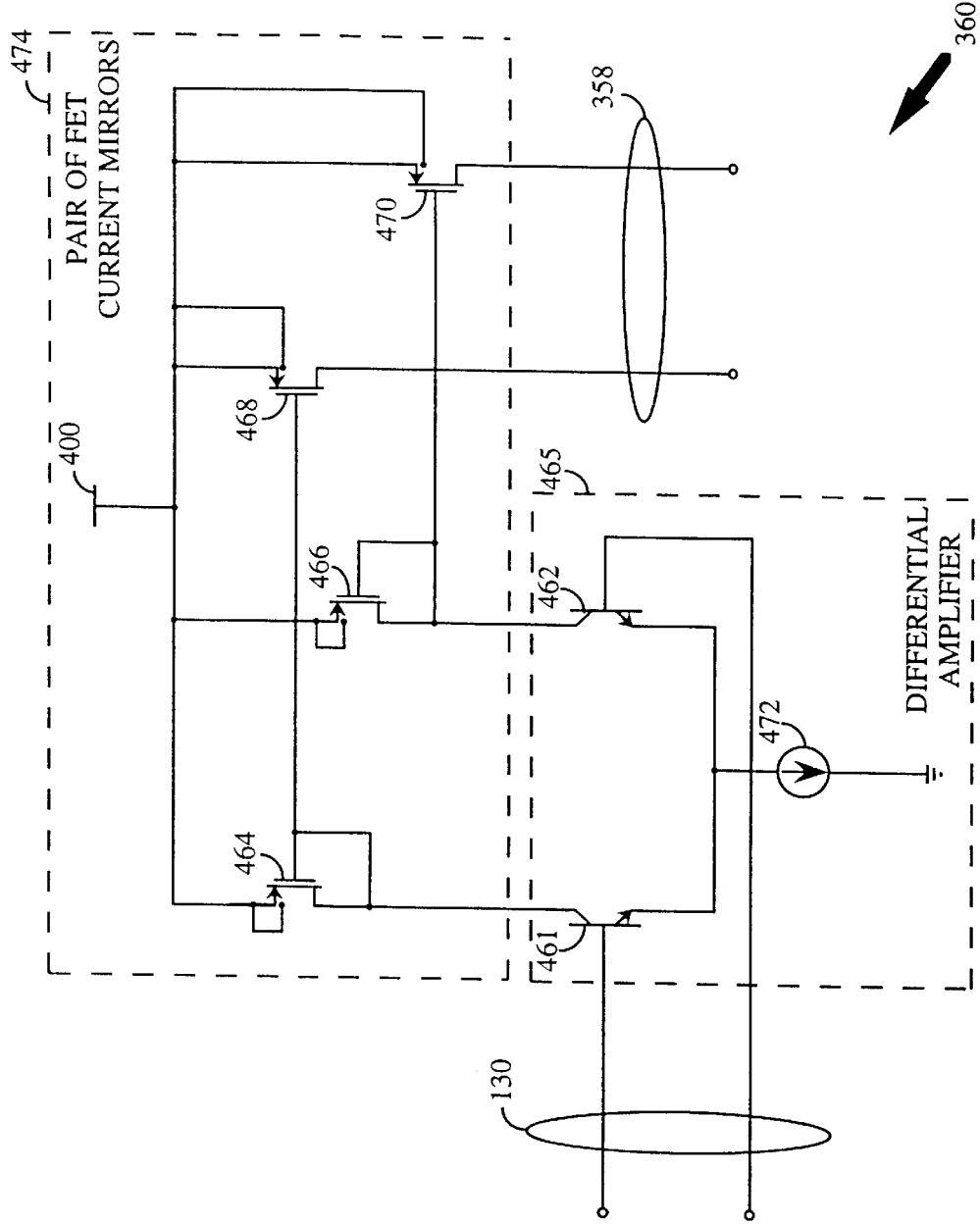
FIG. 5 is a diagram of the exponential function generator of FIG. 4.

FIG. 5 illustrates one embodiment of exponential function generator 360. Exponential function generator 360 comprises differential amplifier 465 having outputs which drive a pair of FET current mirrors 474. Differential amplifier 465 comprises a parallel pair of BJTs 461 and 462 connected to current source 472. Pair of FET current mirrors 474 comprises four FETs 464, 466, 468, and 470. Due to exponential input voltage-output current relationship of BJTs 461 and 462, the ratio of their collector currents is proportional to the differential base voltage between BJTs 461 and 462, which is determined by the control voltage signal. Thus, the linear differential voltage change across bias port 130 is translated to an exponentially related (linear in dB) current at output 358. The current mirrors 474 simply take the exponentially related current generated by the bipolar differential pair 461 and 462 and provide it for use throughout the amplifier. Exponential function generator 360 is biased by a power supply 400.

Referring again to FIG. 4, first and second operational amplifier circuits 353 and 354 act in cooperation with exponential function generator 360 to control the channel resistance of FET 237 of FIG. 3. The first operational amplifier circuit 353 comprises master FET 344, which is preferably identical to FET 237, reference resistor 346 and differential operational amplifier 348. The output currents from exponential function generator 360 are coupled to master FET 344 and reference resistor 346. Differential operational amplifier 348 forces the voltage across the drain and source terminals of master FET 344 and the terminals of reference resistor 346 to be equal by varying the bias voltage applied to the gate of master FET 344. The bias voltages applied to the gates of FET 237 and master FET 344 are generally equal. However, the gate bias voltage applied to FET 237 through bias port 124 is low pass filtered to prevent thermal noise from the transconductance bias control circuitry 140 from being injected onto FET 237. The low pass filtering is accomplished by a low pass filter 352 formed by series resistor 350 and shunt capacitor 351.

Second operational amplifier circuit 354 forces master FET 344 and FET 237 to have the same source voltage. Second operational amplifier comprises a non-inverting, unity gain operational amplifier 349 and resistors 345 and 347, that sense the drain-source voltage across FET 237 via source connection 228 and drain connection 229.

Exponential function generator 360 and current source 341 connected around master FET 344 and reference resistor 346 are designed so that the voltage drop across reference resistor 346, and hence across the drain-source of the master FET 344, is less than the FET's knee voltage. As a result, the operation of operational amplifier circuits 353 and 354 force FET 237 and master FET 344 to operate at similar quiescent points in their ohmic regions. Therefore, the channel resistances of both FET 237 and master FET 344 are generally identical and vary exponentially with a linearly adjusted control voltage applied to the bias port 130.

Figure 6:
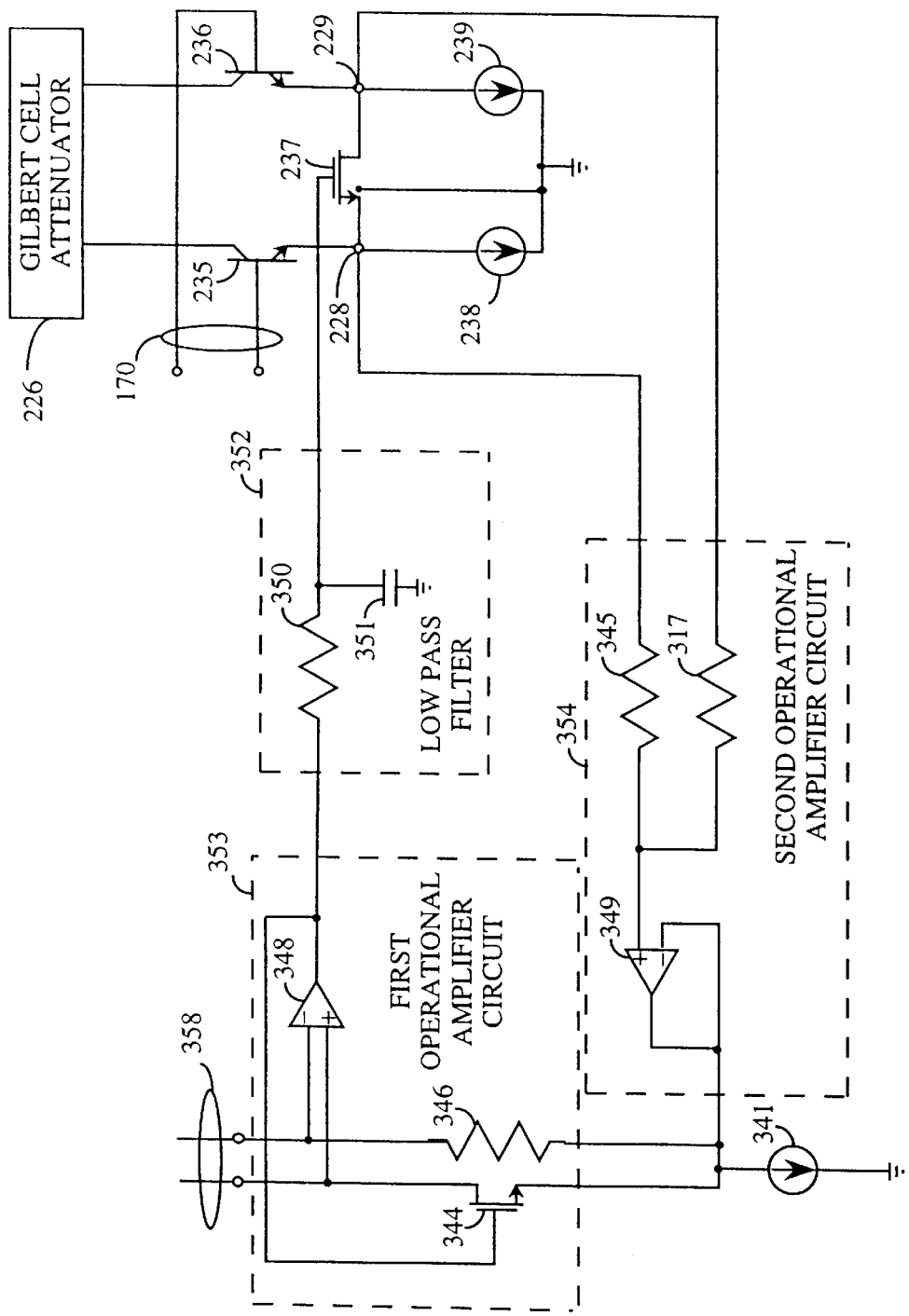
FIG. 6 is a partial combination of elements in FIGS. 2 and 3 constructed to illustrate the beneficial properties of the present invention.

FIG. 6 is a partial combination of elements in FIGS. 2 and 3 constructed to illustrate the beneficial properties of the present invention. One of the issues overcome by the arrangement shown in FIG. 6 is the process variation of $\mu_c C_{ox}$ and hence the channel resistance of FET 237 as a function of voltage applied at its gate. As previously mentioned with respect to FIG. 3, FET 237 controls the transconductance of variable transconductance amplifier 227. The variable emitter degeneration provided by FET 237 enables input stage 120 to handle a wide range of signals.

Because the attenuation caused by input stage 120 is so critical to the operation of the circuit and the characteristics of the stage are set by FET 237, precisely setting the resistive value of FET 237 is very important. Because the channel resistance as a function of applied gate voltage is hard to control from part to part in the manufacturing process, the external control loop is used to achieve consistency. FIG. 6 shows the control loop used to immunize the operation of the CDMA input stage 122 to the process variations of FET 237.

Resistor 346 is an on-chip resistor. This resistor is made large to minimize process variations. Resistor 346 is used as a reference resistance for the control loop.

Note that the total current from output 358 of exponential function generator 360 is set by current source 341. Thus if current through one of the balanced outputs of output 358 increases the current through the other one of the balanced outputs of output 358 decreases. Also note that the voltage drop across resistor 346 is the same as the voltage drop across master FET 344. The voltage drop is the same because each voltage is one of the inputs to op amp 348. The output of op amp 348 controls the resistance of master FET 344 such that the voltage drop across it is the same as the product of the current through resistor 346 and value of resistor 346. Thus as the current through resistor 346 increases and the current through current master FET 344 decreases, the voltage drop across resistor 346 increases. In response, the channel resistance of master FET 344 must also increase so that the voltage drop remains the same. The same output voltage of op amp 348 which is applied to the gate of master FET 344 is also applied to the gate of FET 237. Resistor 350 and capacitor 351 provide a low pass filter between the output of op amp 348 and the gate voltage of FET 237 but the D.C. voltage applied to the gate of master FET 344 and the gate of FET 237 is the same.

In the preferred embodiment, master FET 344 and FET 237 are in close proximity to each other on a common substrate. In this way, even though the process variations from VGA part to VGA part are significant, within a single VGA part, the gate voltage versus channel resistance characteristics of master FET 344 and FET 237 closely track one another. In this way the resistance of FET 237 is set to be equal to the resistance of master FET 344. As the channel resistance of FET 237 decreases, the current flow through transistors 235 and 236 increases. Thus, the present invention provides a way to accurately perform the variable emitter degeneration of CDMA input stage 122.

Figure 7:
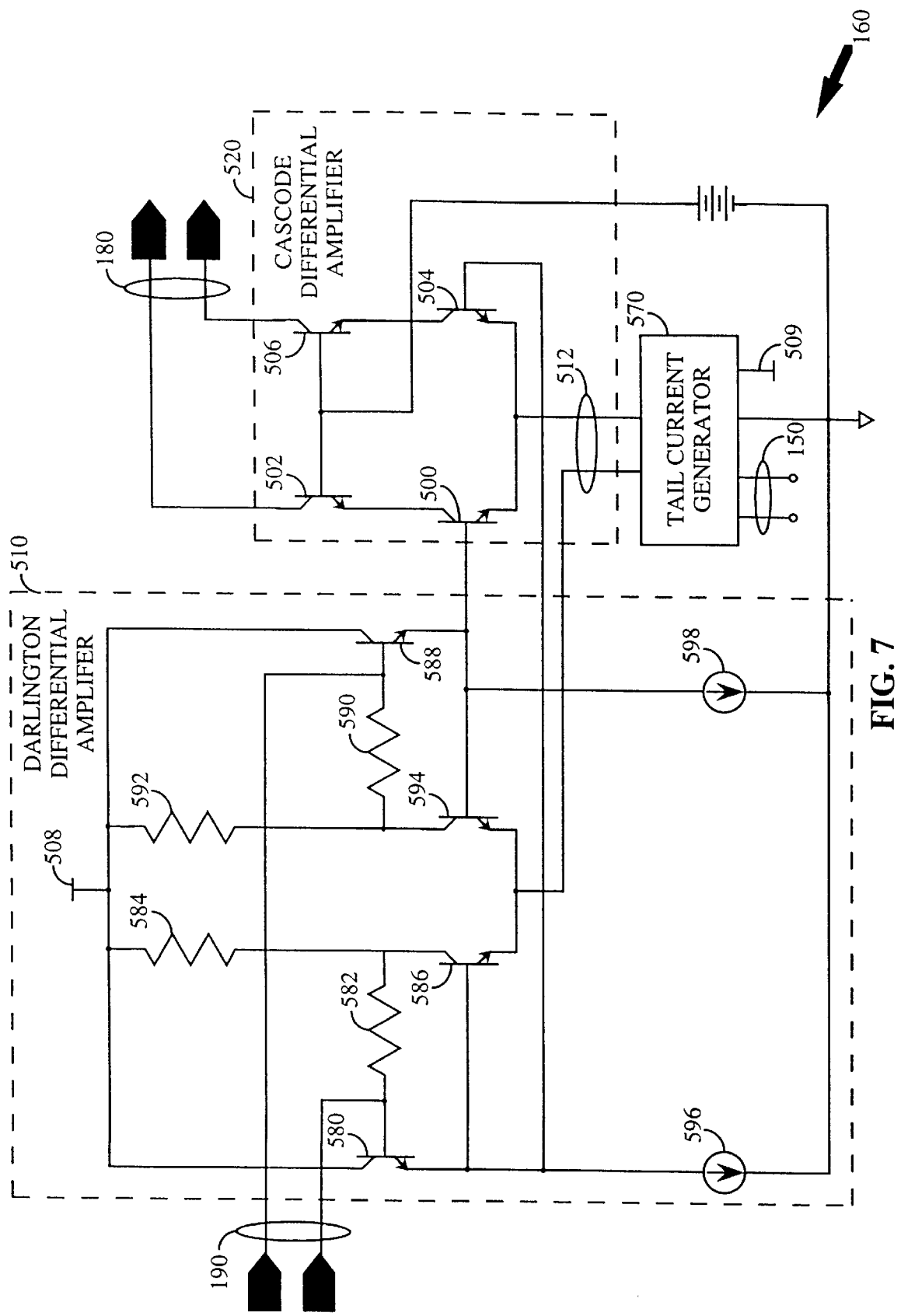
FIG. 7 is a diagram of the current amplifiers of FIG. 2.

FIG. 7 illustrates one embodiment of current amplifiers 160A, 160B as shown in FIG. 2. The input of current amplifier 160 as shown in FIG. 7 may be coupled to the output of input stage 120 or the output of another current amplifier 160. Current amplifier 160 comprises Darlington differential amplifier 510, cascode differential amplifier 520, and tail current generator 570. Current amplifier 160 is biased by power supplies 508 and 509 and current sources 596 and 598. Darlington differential amplifier 510 comprises BJTs 580, 586, 588 and 594 and resistors 582, 584, 590, 592 in a topology shown in FIG. 7 such that Darlington differential amplifier 510 has resistive shunt-series feedback to provide enhanced current gain and process variation insensitivity.

In the present invention, it should be noted that the resistive shunt-series feedback provided by resistors 582, 584, 590, 592 of the present invention attempts to force the feedback current through the resistors to be equal to the input current through input port 190. Thus, since they also provide a current divider, they enhance the current gain of the differential Darlington amplifier 510 by the ratio of the feedback resistors.

Cascode differential amplifier 520 provides a translinear loop which provides variable current amplification according to the ratio of the tail currents 512 generated by tail current generator 570. The cascode differential amplifier comprises BJTs 500, 502, 504 and 506 in the topology of a differential current mirror (translinear loop), which allows the gain of the current amplifier to be varied by varying the tail currents 512.

The gain of current amplifier 160 is controlled by tail current generator 570. Tail current generator 570, through differential port 512, is connected to both Darlington differential amplifier 510 and cascode differential amplifier 520. The current amplification of each of current amplifiers 160 may be varied exponentially by using the control current generated by exponential function generator 360 of FIGS. 4 and 5 applied to control ports 150. Tail current generator 570 is biased by a power supply 509.

Figure 8:
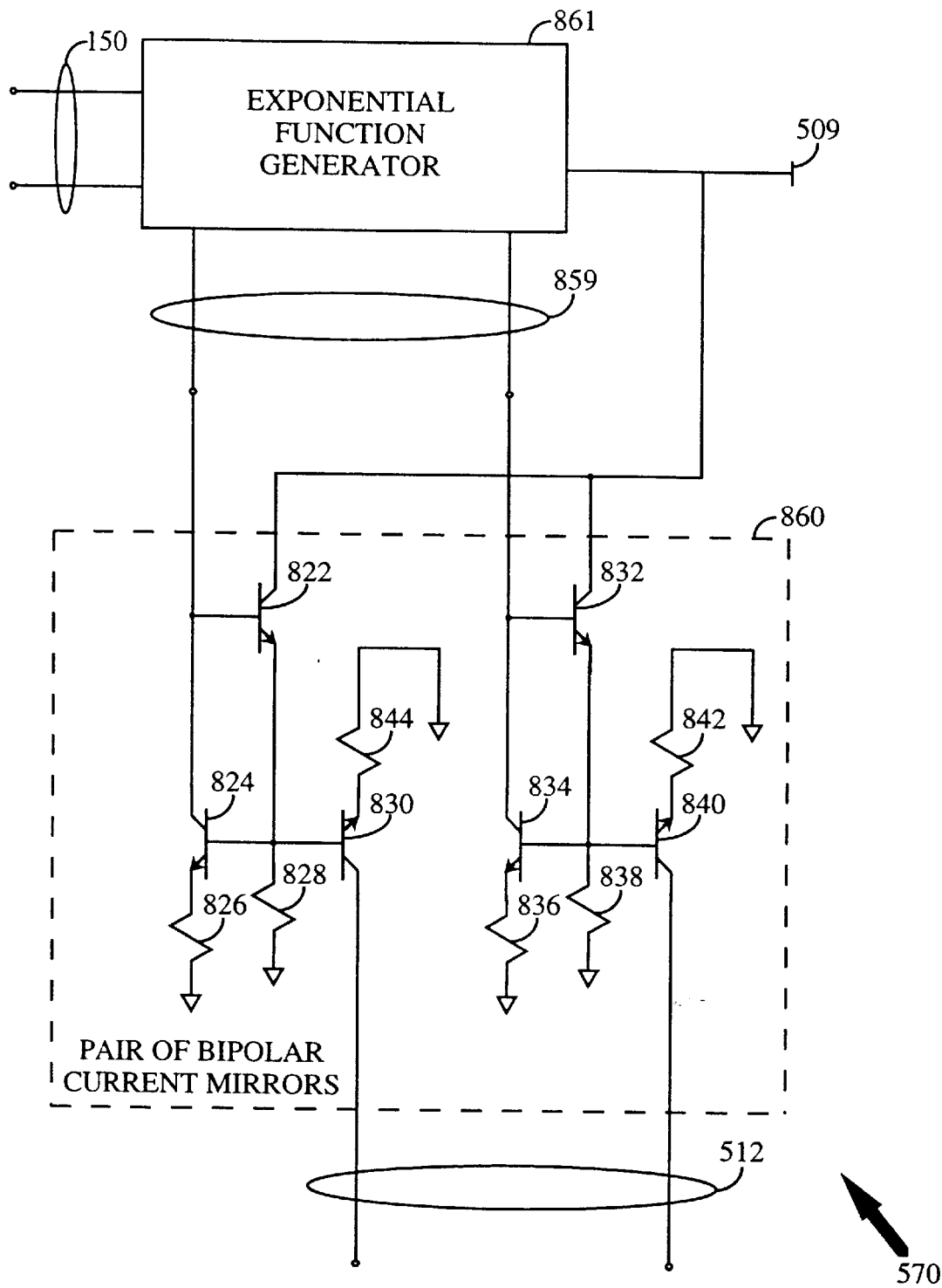
FIG. 8 is a diagram of the tail current generator of FIG. 7.

FIG. 8 illustrates one embodiment of tail current generator 570. Tail current generator 570 comprises an exponential function generator 861 which may be similar or the same element as exponential function generator 360 (FIGS. 4 and 5) which produces output 859 which are similar or the same as output 358 of exponential function generator 360. Exponential function generator 861 is coupled to a pair of bipolar current mirrors 860. In FIG. 8, both circuits are coupled to a power supply 509, however they may also be coupled to different power supplies. Pair of bipolar current mirrors 860 are comprised of first BJT group 822, 824 and 830, and second BJT group 832, 834 and 840 and first resistor group 826, 828, and 844, and second resistor group 836, 838, and 842. The purpose of the pair of bipolar current mirrors is to take the control current provided by exponential function generator 861 and transform it into the tail currents 512.

In one embodiment of the present invention, exponential function generator 360 and 861 are the same element, thus advantageously providing a single control current which may be mirrored to CDMA input stage 122, as well as current amplifiers 160A and 160B. This embodiment provides even further DC efficiency by reducing the current gain (and thus the DC current drain on the batteries) of current amplifiers 160A and 160B at the same time and in the same proportion as the transconductance of CDMA input stage 122 is reduced. Furthermore, this arrangement ensures that all current amplification in all stages are exponentially related (linear in dB) to the control voltage of the AGC amplifier.

Thus, the present invention provides a VGA that has a high dynamic range over both CDMA and FM signals, with a maximum of sharing of elements in both CDMA and FM modes. A mobile receiver utilizing such a VGA can detect signals over wider input power ranges. The VGA also consumes minimal DC power. Therefore, the VGA may be used in a mobile communication device and advantageously conserve the operating lifetime of the batteries. Finally, the VGA's gain can be varied linearly in dB by linearly adjusting DC control voltages.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. A variable gain amplifier comprising:
    a transconductance input stage including at least one transistor having variable emitter degeneration, said transconductance input stage having a pair of differential voltage inputs for receiving a signal to be amplified and having a pair of differential current outputs;
    at least one current amplifier coupled to said differential current outputs for amplifying said signal to be amplified; and
    a control circuit, coupled to said transconductance input stage and said at least one current amplifier, for applying a control signal to said transconductance input stage and said at least one current amplifier, said control signal for exponentially varying a gain of said transconductance input stage and said at least one current amplifier in response to a linear variation in a control voltage;

wherein said transconductance input stage comprises:
    a fixed transconductance input stage;
    a variable transconductance input stage, said variable transconductance being varied by said control signal; and
    a mode selection switch, coupled to said fixed transconductance input stage and said variable transconductance input stage, for alternately coupling said fixed transconductance input stage and said variable transconductance input stage to said at least one current amplifier in response to a mode selection signal.

2. The variable gain amplifier of claim 1 wherein said transconductance input stage comprises:
    a first bipolar junction transistor having a base coupled to a first one of said differential voltage inputs;
    a second bipolar junction transistor having a base coupled to a second one of said differential voltage inputs; and
    a slave field effect transistor having a source coupled to an emitter of said first bipolar junction transistor and a drain coupled to an emitter of said second bipolar junction transistor and a gate coupled to said control circuit for receiving said control signal, whereby said control signal varies a channel resistance of said slave field effect transistor, thereby varying said variable emitter degeneration.

3. The variable gain amplifier of claim 2 wherein said transconductance input stage further comprises an attenuator for limiting said differential current output.

4. The variable gain amplifier of claim 2 wherein said control circuit comprises:
    an exponential function generator for translating a linear change in said control voltage to an exponential change in a control current;
    a first operational amplifier circuit, coupled to said exponential function generator and receiving said control current, said first operational amplifier circuit for controlling said channel resistance of said slave field effect transistor; and
    a second operational amplifier circuit for controlling a drain-source voltage of said slave field effect transistor.

5. The variable gain amplifier of claim 4 wherein said first operational amplifier circuit comprises
    a master field effect transistor coupled in parallel with a reference resistor; and
    an operational amplifier for forcing said channel resistance of said slave field effect transistor to be the same as a channel resistance of said master field effect transistor.

6. A variable gain amplifier comprising:
    a transconductance input stage including at least one transistor having variable emitter degeneration, said transconductance input stage having a pair of differential voltage inputs for receiving a signal to be amplified and having a pair of differential current outputs;
    at least one current amplifier coupled to said differential current outputs for amplifying said signal to be amplified; and
    a control circuit, coupled to said transconductance input stage and said at least one current amplifier, for applying a control signal to said transconductance input stage and said at least one current amplifier, said control signal for exponentially varying a gain of said transconductance input stage and said at least one current amplifier in response to a linear variation in a control voltage, wherein said at least one current amplifier comprises:
a differential Darlington amplifier having resistive shunt-series feedback;
a differential cascode amplifier, coupled to said differential Darlington amplifier as a translinear loop; and
a tail current generator, coupled to said control circuit, said differential Darlington amplifier, and said differential cascode amplifier, said tail current generator for generating a differential pair of tail currents whereby a gain of said current amplifier is proportional to a ratio of said differential pair of tail currents.

7. The variable gain amplifier of claim 6 wherein said differential Darlington amplifier comprises:
a first bipolar junction transistor having a base coupled to one of said differential current outputs of said transconductance input stage;
a second bipolar junction transistor having a base coupled to another one of said differential current outputs of said transconductance stage;
a first current divider coupled at a first end to a collector of said first bipolar junction transistor and coupled at a second end to said base of said first bipolar junction transistor; and
a second current divider coupled at a first end to a collector of said second bipolar junction transistor and coupled at a second end to said base of said second bipolar junction transistor, whereby a current gain of said differential Darlington amplifier is increased by a ratio of resistance within said first and second current dividers.

8. An amplifier for processing an input signal comprising:
an input stage including a transconductance amplifier having variable transconductance;
a Gilbert cell attenuator coupled to said transconductance amplifier;
a current amplifier, coupled to said input stage; and
means for applying a linearly adjusted control voltage to said current amplifier to exponentially vary the gain of said amplifier as a function of the applied control voltage.

9. The amplifier of claim 8, wherein said input signal includes two balanced signals, and wherein said transconductance amplifier further comprises:
first active devices, wherein each balanced signal is injected into a respective input of said first active devices;
current sources respectively coupled to said first active devices; and
a variable resistor coupled to said first active devices and said current sources.

10. The amplifier of claim 9, wherein said attenuator further comprises:
second active devices; and
third active devices, wherein said second active devices and said third active devices are coupled to the first active devices.

11. An amplifier for processing an input signal comprising:
an input stage including a transconductance amplifier having variable transconductance;
a transconductance amplifier bias control circuit coupled to said transconductance amplifier;
a current amplifier, coupled to said input stage; and
means for applying a linearly adjusted control voltage to said current amplifier to exponentially vary the gain of said amplifier as a function of the applied control voltage,
wherein said transconductance bias control circuit further comprises:
an exponential function generator;
a first operational amplifier circuit coupled to said exponential function generator;
a second operational amplifier circuit coupled to said first operational amplifier circuit; and
a current source coupled to said first operational amplifier circuit.

12. The amplifier of claim 11, wherein said transconductance amplifier bias control circuit further comprises a low-pass filter coupled to said first operational amplifier circuit.

13. The amplifier of claim 11, wherein said exponential function generator comprises:
a pair of active devices;
a current source coupled to said active devices; and
a pair of current mirrors respectively coupled to said active devices.

14. The amplifier of claim 11, wherein said first operational amplifier circuit further comprises:
a master active device;
a reference resistor coupled to said master active device; and
a differential amplifier having first and second inputs and an output, wherein said master active device is coupled to said first input and said output of said differential amplifier, and said reference resistor is coupled to said second input of said differential amplifier.

15. The amplifier of claim 11, wherein said second operational amplifier circuit further comprises:
a non-inverting unity gain amplifier having first and second inputs;
a first input resistor coupled to said first input of said non-inverting unity gain amplifier; and
a second input resistor coupled to said second input of said non-inverting unity gain amplifier.

16. A method of amplifying an input signal in an amplifier having a fixed transconductance input stage and a variable transconductance input stage, said fixed transconductance input stage and said variable transconductance input stage being coupled to a current amplifier via a mode selection switch, the method comprising the steps of:
applying an input signal to said fixed transconductance input stage and said variable transconductance input stage; and
selectively applying an output of said fixed transconductance input stage or said variable transconductance input stage to said current amplifier in response to a mode selection signal.

17. The method of claim 16, further comprising the step of:
applying a linearly changeable control voltage to the amplifier to produce corresponding exponential changes in current amplitude of the input signal.

18. The method of claim 16, further comprising the step of:
generating a pair of currents, the ratio of whose amplitudes varies exponentially with a control voltage, so as to vary current amplitude of the input signal.

* * * * *